United States Patent
Schmitt

(10) Patent No.: US 8,159,895 B2
(45) Date of Patent: Apr. 17, 2012

(54) METHOD AND SYSTEM FOR SPLIT THRESHOLD VOLTAGE PROGRAMMABLE BITCELLS

(75) Inventor: Jonathan Schmitt, Eden Prairie, MN (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/173,149

(22) Filed: Jun. 30, 2011

(65) Prior Publication Data
US 2011/0255327 A1    Oct. 20, 2011

Related U.S. Application Data

(63) Continuation-in-part of application No. 12/689,122, filed on Jan. 18, 2010, now Pat. No. 8,089,821, and a continuation of application No. 11/505,744, filed on Aug. 17, 2006, now Pat. No. 7,649,798.

(51) Int. Cl.
*G11C 7/00* (2006.01)
(52) U.S. Cl. .................. 365/225.7; 365/230.03
(58) Field of Classification Search .............. 365/225.7, 365/230.03
See application file for complete search history.

(56) References Cited

U.S. PATENT DOCUMENTS

| | | | | |
|---|---|---|---|---|
| 4,630,237 A | * | 12/1986 | Miura et al. | 365/104 |
| RE32,401 E | * | 4/1987 | Beilstein et al. | 365/182 |
| 6,492,690 B2 | * | 12/2002 | Ueno et al. | 257/392 |
| 7,649,798 B2 | * | 1/2010 | Schmitt et al. | 365/225.7 |

* cited by examiner

*Primary Examiner* — Michael Tran
(74) *Attorney, Agent, or Firm* — Brinks Hofer Gilson & Lione

(57) ABSTRACT

Methods and systems for split threshold voltage programmable bitcells are disclosed and may include selectively programming bitcells in a memory device by applying a high voltage to a gate terminal of the bitcells, where the programming burns a conductive hole in an oxide layer above a higher threshold voltage layer in a memory device. The bitcells may comprise an oxide layer and a doped channel, which may comprise a plurality of different threshold voltage layers. The plurality of different threshold voltage layers may comprise at least one layer with a higher threshold voltage and at least one layer with a lower threshold voltage. The oxide may comprise a gate oxide. The bitcell may comprise an anti-fuse device. The layer with a higher threshold voltage may be separated from an output terminal of the bitcell by the at least one layer with a lower threshold voltage.

24 Claims, 6 Drawing Sheets

METHOD AND SYSTEM FOR SPLIT THRESHOLD VOLTAGE PROGRAMMABLE BITCELLS

CROSS-REFERENCE TO RELATED APPLICATIONS/INCORPORATION BY REFERENCE

This is a continuation-in-part of application Ser. No. 12/689,122 filed on Jan. 18, 2010, which is a continuation of application Ser. No. 11/505,744, filed on Aug. 17, 2006.

Each of the above referenced applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to memory. More specifically, certain embodiments of the invention relate to a method and system for split threshold voltage programmable bitcells.

BACKGROUND OF THE INVENTION

Improvements in integrated circuit technology have produced smaller devices with higher performance and reduced power consumption. These improvements may be employed in the fabrication of integrated circuits such as integrated circuit memories. One such memory comprises a one time programmable memories (OTPs). When designing or fabricating a one time programmable memory (OTP), the supply voltages that are used to power the OTP may be large because of internal design requirements. Such internal design requirements may be related to the voltage level requirements of the individual components that are used to implement the OTP. These voltage levels may be related to proper biasing of the electronic components in the OTP. When an OTP is implemented using NMOS (n channel MOSFET) logic, proper forward biasing of an n channel MOSFET may result in a voltage drop, $V_T$, across the gate to the drain of such a transistor, for example. Unfortunately, such voltage drops may relate to increases in power consumption when operating a one time programmable memory (OTP).

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for split threshold voltage programmable bitcells, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for split threshold voltage programmable bitcells. Exemplary aspects of the invention may comprise selectively programming one or more bitcells of an array of bitcells in a memory device by applying a high voltage to a gate terminal of the one or more of the array of bitcells. The programming burns a conductive hole in an oxide layer above a higher threshold voltage layer in a memory device. The bitcells may comprise an oxide layer and a doped channel, which may comprise a plurality of different threshold voltage layers. The plurality of different threshold voltage layers may comprise at least one layer with a higher threshold voltage and at least one layer with a lower threshold voltage. The oxide may comprise a gate oxide. The bitcell may comprise an anti-fuse device. The layer with a higher threshold voltage may be separated from an output terminal of the bitcell by the at least one layer with a lower threshold voltage. The array of bitcells may comprise complementary metal-oxide semiconductor (CMOS) devices. The lower threshold voltage layer may comprise a high time-dependent dielectric breakdown material and the higher threshold voltage layer may comprise a low time-dependent dielectric breakdown material. A gate length of the one or more of the bitcells may be configured by the programming. The bitcell may comprise an NMOS or a PMOS device.

Figure 1A:
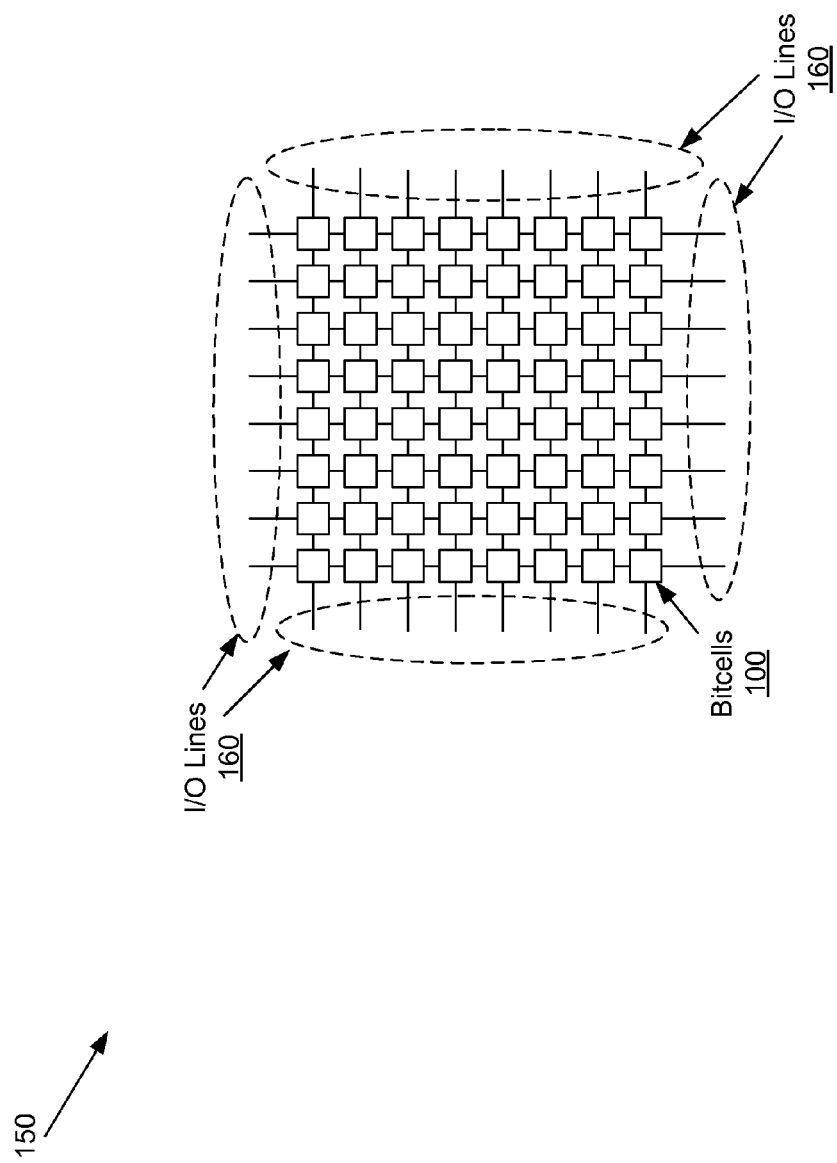
FIG. 1A is a block diagram illustrating a bitcell array, in accordance with an embodiment of the invention.

FIG. 1A is a block diagram illustrating a bitcell array, in accordance with an embodiment of the invention. Referring to FIG. 1, there is shown a bitcell array 150 comprising an array of bitcells 100 and input/output lines 160. The bitcells 100 may each comprise a single memory bit that may be programmed as a digital '1' or '0' by applying appropriate voltages on the bitcells. The bitcell array 150 may comprise a one-time programmable memory, where the programming of a bit permanently configures the bitcell. One-time programmable memories may be used to store device-specific data, such as a chip identification, for example.

The bitcells 100 may comprise anti-fuse devices, where programming the device results in a conductive CMOS transistor element, and an un-programmed device flows little or no current upon bias. This programming may be achieved by applying a bias voltage across a CMOS gate oxide such that a "hole" is burned in the oxide and becomes conductive at that point. This may result in a gate/drain coupled CMOS transistor that flows current upon an applied bias at the gate/drain, read out through the source terminal, for example.

Figure 1B:
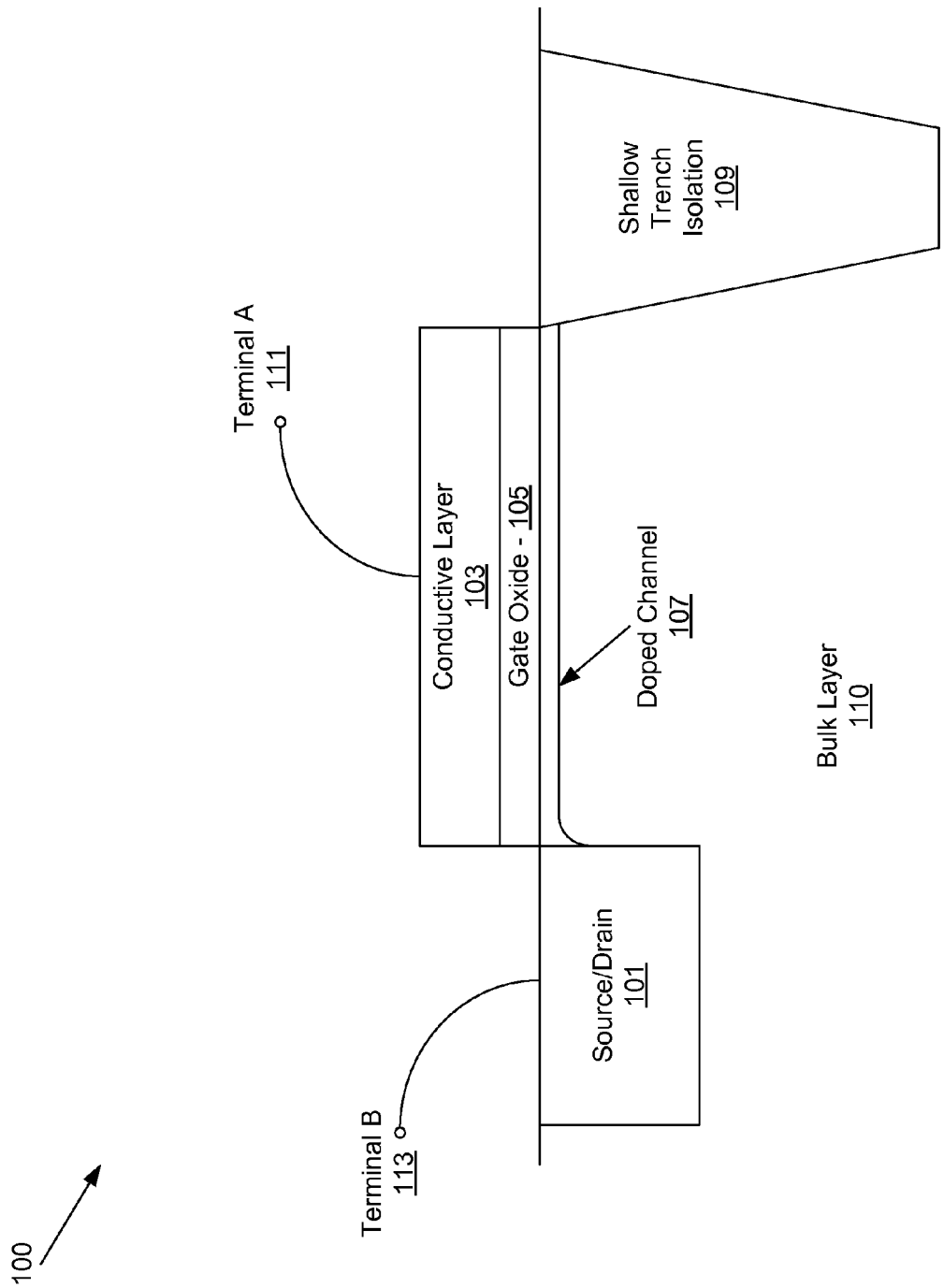
FIG. 1B is a block diagram illustrating an exemplary single threshold voltage bitcell, in accordance with an embodiment of the invention.

FIG. 1B is a block diagram illustrating an exemplary single threshold voltage bitcell, in accordance with an embodiment of the invention. Referring to FIG. 1B, there is shown a bitcell 100 comprising a source/drain layer 101, a conductive layer 103, a gate oxide 105, a doped channel 107, a shallow trench isolation 109, and a bulk layer 110. The bitcell 100 may be configured to operate as an anti-fuse, such that the device may be programmed by creating a conductive path through the gate oxide 105, thereby changing the bitcell 100 from OFF to ON. An array of bitcells such as the bitcell 100 may be integrated on a chip, thereby creating a programmable memory on a chip.

The source/drain layer 101 may comprise a doped semiconductor layer with a doping level suitable for a source or drain in a complementary metal-oxide semiconductor (CMOS) transistor. The source/drain layer 101 may be doped using diffusion or ion implantation, for example, and may be a source or a drain depending on whether the device is p-channel metal-oxide semiconductor (PMOS) or n-channel metal-oxide semiconductor (NMOS), respectively.

The conductive layer 103 may comprise a conductive material, such as a metal or polysilicon material, and may enable an electrical connection to the bitcell 100. The conductive layer 103 may be isolated from the doped channel 107 by the gate oxide 105.

The gate oxide 105 may comprise an oxide layer deposited and/or grown on the doped channel 107, and may isolate the conductive layer 103 from the doped channel 105. The gate oxide 105 may comprise defects that may be utilized to burn a channel through the gate oxide 103, as described further with respect to FIG. 2.

The doped channel 107 may comprise a layer of desired doping level formed within the bulk layer 110, thereby enabling a conductive channel once a hole is formed in the gate oxide 105. The doped channel may be formed by diffusion or ion implantation, for example.

The shallow trench isolation 109 may comprise a region etched from the bulk layer 110 to provide isolation between adjacent bitcells. The shallow trench isolation 109 may be filled with a dielectric, for example to provide further electrical isolation.

The bulk layer 110 may comprise a semiconductor layer of a desired doping level, such that a MOS transistor may be formed by doping source and drain layers, as well as incorporating an oxide and conductive layer. For example, an n-channel MOS transistor may be formed with a p-doped bulk layer 110 and a doped channel 107 with n-type doping.

The terminal A 111 may comprise a connection to devices or circuits external to the bitcell 100, thereby enabling the communication of voltages and/or other signals to the bitcell 100. For example, a programming voltage may be applied to the terminal A 111 to create a hole in the gate oxide 105, as described with respect to FIG. 2, thereby changing the state of the bitcell 100.

The terminal B 113 may comprise a connection to devices or circuits external to the bitcell 100, thereby enabling the communication of voltages and/or other signals from the bitcell 100. The terminal A 111 may be operable to sense the state of the bitcell 100, such as a digital '1' or '0'.

In operation, a voltage may be applied to the terminal A 111, but since no hole has been formed in the gate oxide 105, there is little or no current sensed at the output terminal B 113. This configuration may be defined as a digital '1' or a digital '0' for the bitcell 100.

Figure 2:
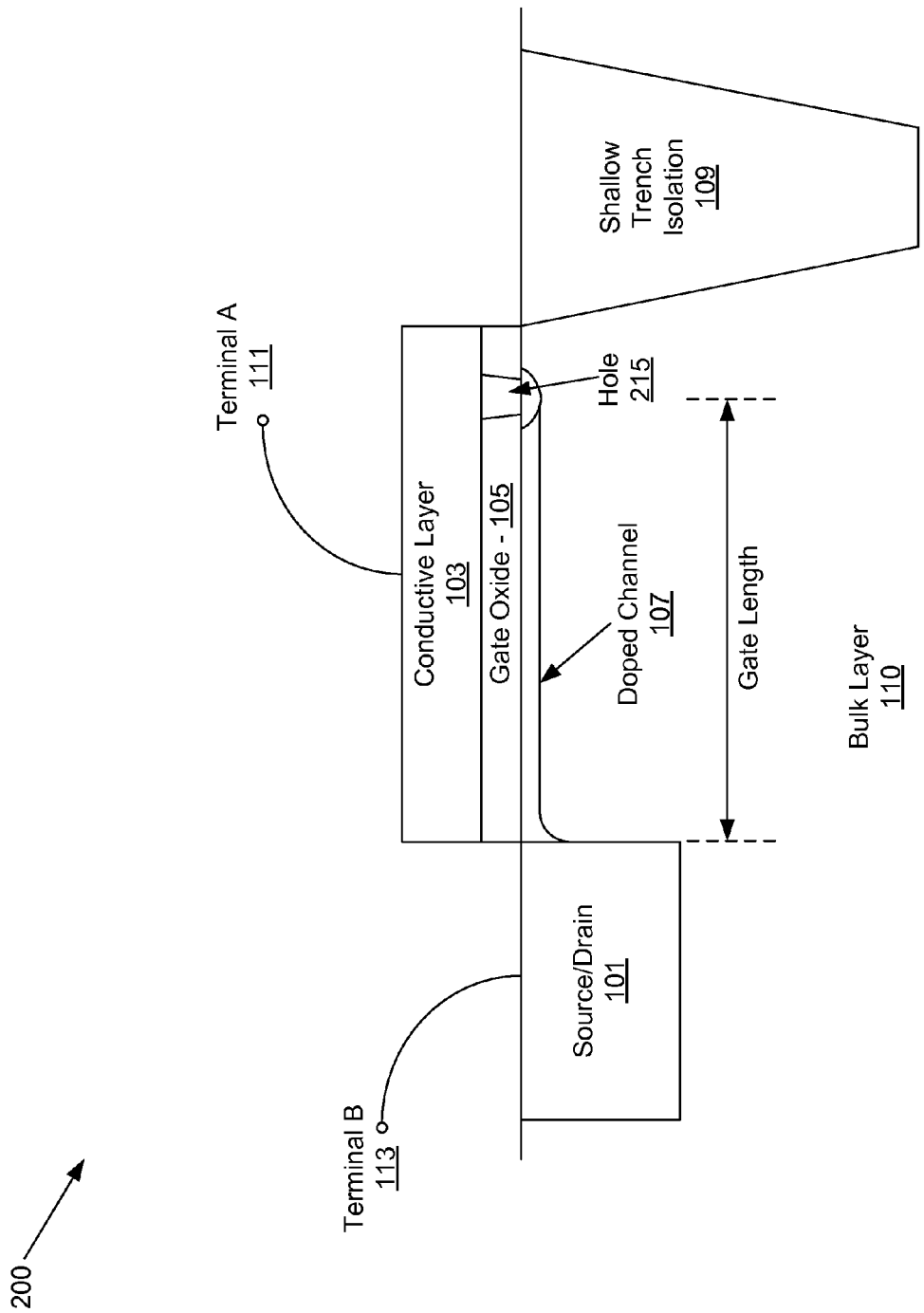
FIG. 2 is a block diagram illustrating an exemplary programmed single threshold voltage bitcell, in accordance with an embodiment of the invention.

FIG. 2 is a block diagram illustrating an exemplary programmed single threshold voltage bitcell, in accordance with an embodiment of the invention. Referring to FIG. 2, there is shown a bitcell 200 comprising the source/drain layer 101, the conductive layer 103, the gate oxide 105, the doped channel 107, the shallow trench isolation 109, and a hole 215.

The source/drain layer 101, the conductive layer 103, the gate oxide 105, the doped channel 107, the shallow trench isolation 109, the terminal A 111, and the terminal B 113 may be substantially as described with respect to FIG. 1B.

The hole 215 may comprise a conductive region burned into the gate oxide 105, thereby allowing the flow of current between the terminal A 111 and the terminal B 113. A bitcell, such as the bitcell 100, may be programmed by applying sufficient voltage to form the hole 215 in the gate oxide 105 as a result of defects in the oxide layer.

In operation, a high voltage may be applied to the terminal A 111 and a low voltage applied to the terminal B 113, such that the total voltage, which drops mostly across the high resistivity gate oxide 105, results in a high enough electric field in the gate oxide 105 to "burn" a hole in the oxide. The hole 215 may comprise an alloy of polysilicon, doped semiconductor from the doped channel 107, and defects in the gate oxide 105. This may result in a conductive path through the gate oxide, in effect programming the bitcell 200 to the opposite state of the bitcell 100, described with respect to FIG. 1B.

Once a conductive path has been burned through the gate oxide 105, a current may flow with an applied bias across the terminal A 111 and the terminal B 113, opposite to the operation of the bitcell 100, described with respect to FIG. 1B. The formation of the hole 215 may be dependent on the random location of defects in the gate oxide 105, such that the gate length, defined by the distance from the hole 215 to the source/drain 101, may be different among different bitcells on a chip, and may be formed anywhere along the doped channel 107. In instances where the hole 215 forms close to the source/drain 101, short channel effects may reduce the reliability of the bitcell 200. Furthermore, over time the current magnitude and the threshold voltage of the bitcell 200 may shift, making the bitcell 200 appear to be less and less programmed.

Figure 3:
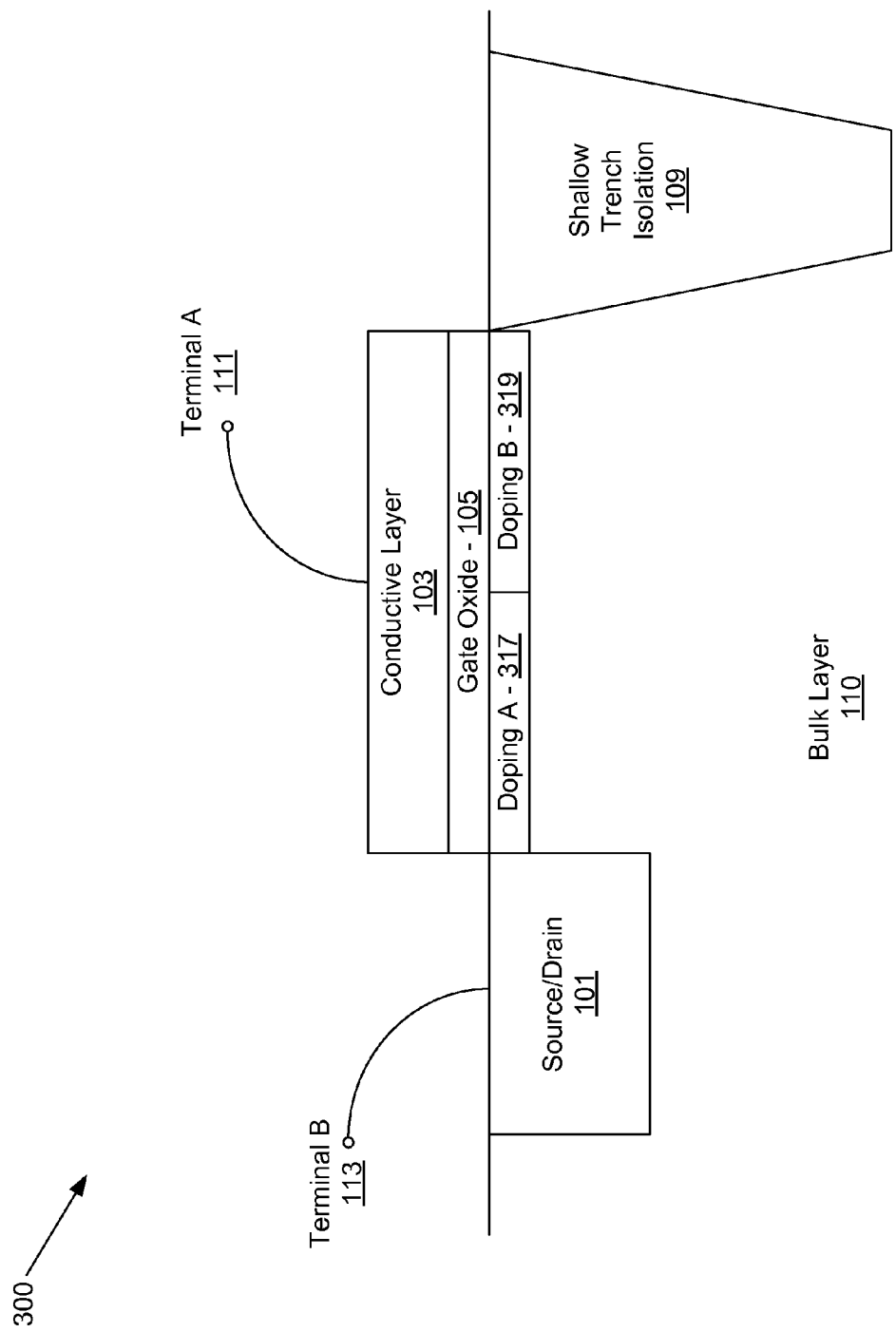
FIG. 3 is a block diagram illustrating an exemplary split threshold voltage bitcell, in accordance with an embodiment of the invention.

FIG. 3 is a block diagram illustrating an exemplary split threshold voltage bitcell, in accordance with an embodiment of the invention. Referring to FIG. 3, there is shown a bitcell 300 comprising the source/drain layer 101, the conductive layer 103, a gate oxide 105, the shallow trench isolation 109, a doping A layer 317 and a doping B layer 319.

The bitcell 300 may be configured to operate as an anti-fuse, such that the device may be programmed by creating a conductive path through the gate oxide 105, thereby changing the bitcell 300 from OFF to ON. The source/drain layer 101, the conductive layer 103, the gate oxide 105, the doped channel 107, the shallow trench isolation 109, the terminal A 111, the terminal B 113, and the bulk layer 110 may be substantially as described with respect to FIG. 1B.

The doping A layer 317 may comprise a doped semiconductor layer with a lower threshold voltage and a high gate voltage breakdown, or a high time-dependent dielectric breakdown. The doping B layer 319 may comprise a doped semiconductor layer with a low gate voltage breakdown and high threshold voltage, thereby resulting in hole formation in a region above the doping B layer 319, instead over doping A layer 317, where it may be more susceptible to threshold voltage shifts. The doping of the doping A layer 317 and the doping B layer 319 may be n-type or p-type, depending on whether the bitcell comprises an NMOS or PMOS device, for example. In another embodiment of the invention, the low and high threshold layer materials may comprise either a low or a high time-dependent dielectric breakdown material.

Figure 4:
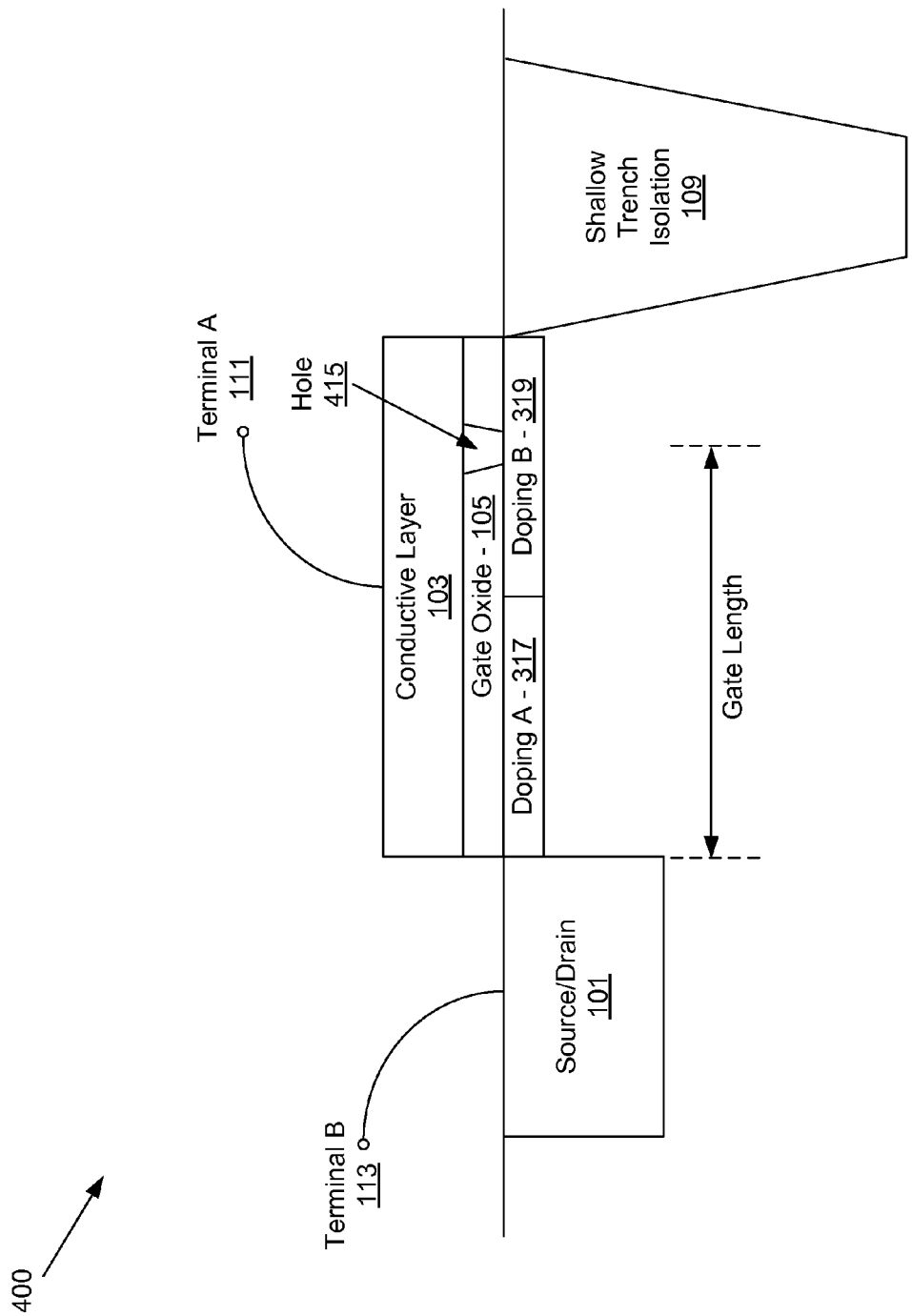
FIG. 4 is a block diagram illustrating an exemplary programmed split threshold bitcell, in accordance with an embodiment of the invention.

Furthermore, the doping B layer 319 may be of a specific size and placement to enable the desired placement of a subsequent hole, as described with respect to FIG. 4. This enables the physical layout of the bitcell 300 to control where the gate breakdown may occur, which controls the gate length of the resulting transistor diode. Thus, the reliability of bitcell may be more controlled than in the bitcells 100 and 200.

In operation, a voltage may be applied to the terminal A 111, but since no hole has been formed in the gate oxide 105, there is little or no current sensed at the output terminal B 113. This configuration may be defined as a digital '1' or a digital '0' for the bitcell 300.

FIG. 4 is a block diagram illustrating an exemplary programmed split threshold bitcell, in accordance with an embodiment of the invention. Referring to FIG. 4, there is shown a bitcell 400 comprising the source/drain layer 101, the conductive layer 103, the gate oxide 105, the doped channel 107, the shallow trench isolation 109, the doping A layer 317, the doping B layer 319, and a hole 415.

The source/drain layer 101, the conductive layer 103, the gate oxide 105, the doped channel 107, the shallow trench isolation 109, the terminal A 111, and the terminal B 113 may be substantially as described with respect to FIG. 1B, and the doping A layer 317 and the doping B layer 319 may be substantially as described with respect to FIG. 3.

The hole 415 may comprise a conductive region burned into the gate oxide 105, thereby allowing the flow of current between the terminal A 111 and the terminal B 113. A bitcell, such as the bitcell 400 may be programmed by applying sufficient voltage to form the hole 415 in the gate oxide 105 as a result of defects in the oxide layer. Since the doping B layer 319 may comprise a lower breakdown voltage material compared to the doping A layer 319, the hole may be controllably formed over the doping B layers in all bitcells in a chip, primarily dependent on the placement of the doping layer as opposed to the random placement of defects in the gate oxide 105. The dimensions of the doping A layer 317 and the doping B layer 319 are not limited to the structure shown in FIG. 4. For example, the doping B layer 319 may be substantially narrower, or may comprise a narrow channel surrounded by doping A layers to further delineate the placement of subsequently burned hole.

In operation, a high voltage may be applied to the terminal A 111 and a low voltage applied to the terminal B 113, such that the total voltage, which drops mostly across the high resistivity gate oxide 105, results in a high enough electric field in the gate oxide 105 to "burn" a hole in the oxide. The hole 415 may comprise an alloy of polysilicon, doped semiconductor from the doping B layer 319, and defects in the gate oxide 105. This may result in a conductive path through the gate oxide, in effect programming the bitcell 400 to the opposite state of the bitcell 100, described with respect to FIG. 1B. Since the hole 415 may be formed at a longer distance from the source/drain 101, defined by the dimensions of the doping A layer 317 and the doping B layer 319, relative variations due to short-channel effects may be reduced compared to the bitcell 200.

Once a conductive path has been burned through the gate oxide 105, a current may flow with an applied bias across the terminal A 111 and the terminal B 113, opposite to the operation of the bitcell 300, described with respect to FIG. 3. The formation of the hole 415 may be defined by the dimensions and placement of the doping A layer 317 with respect to the doping B layer 319, thereby resulting in a more controllable performance of bitcells in an array.

Figure 5:
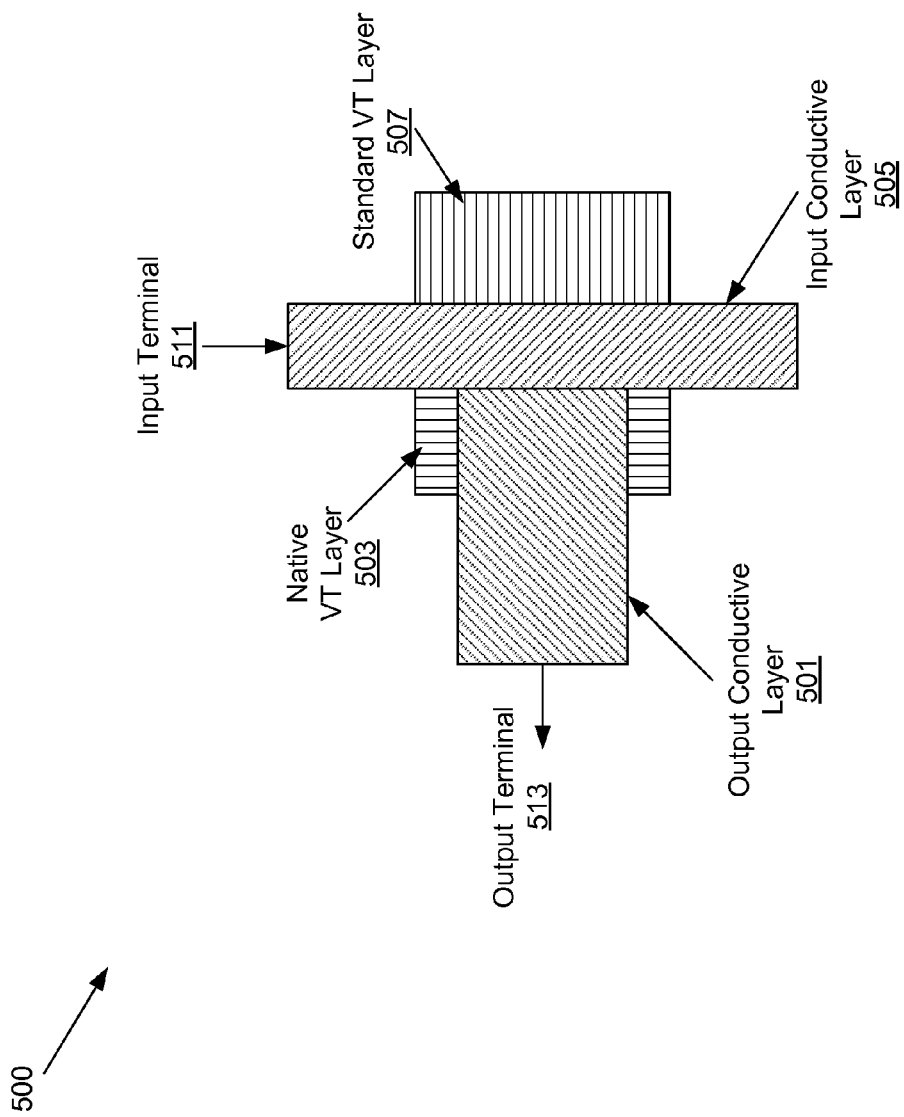
FIG. 5 is a block diagram illustrating a top view of an exemplary split threshold voltage bitcell, in accordance with an embodiment of the invention.

FIG. 5 is a block diagram illustrating a top view of an exemplary split threshold voltage bitcell, in accordance with an embodiment of the invention. Referring to FIG. 5, there is shown a bitcell 500 comprising an output conductive layer 501, a native threshold voltage layer 503, an input conductive layer 505, a standard threshold voltage layer 507, an input terminal 511, and an output terminal 513.

The native threshold voltage layer 503, the input conductive layer 505, the standard threshold voltage layer 507, the input terminal 511, and the output terminal 513 may correspond to the doping A layer 317, the conductive layer 103, the doping B layer 319, the terminal A 111, and the terminal B, described with respect to FIG. 3. The output conductive layer 501 may comprise a conductive material, similar to the conductive layer 103, for example, that may enable electrical contact to the source/drain, such as the source/drain 100, of the bitcell 500.

The native threshold voltage layer 503 and the standard threshold voltage layer 507 may overlap under the input conductive layer 505, with an oxide layer, such as the gate oxide 105, not shown in this view, isolating the layers from the input conductive layer 505 and the output conductive layer 501.

In operation, a high voltage may be applied to the input terminal 511 and a low voltage applied to the output terminal 513, such that the total voltage, which drops mostly across the high resistivity gate oxide separating the layers, results in a high enough electric field in the gate oxide to "burn" a hole in the oxide. This may result in a conductive path through the gate oxide, in effect programming the bitcell 500 to the opposite state of the bitcells 100 and 300, described with respect to FIGS. 1 and 3. By configuring the line where the native threshold voltage layer 503 and the standard threshold voltage layer 507 may overlap, the placement of the burned hole may be configured at a desired location. Since the hole may be formed at a longer distance from the source/drain, such as the source/drain 101, relative variations due to short-channel effects may be reduced compared to the bitcell 200.

Once a conductive path has been burned through the gate oxide 105, a current may flow with an applied bias across the input terminal 511 and the output terminal 513, opposite to the operation of the bitcell 300, described with respect to FIG. 3.

In an embodiment of the invention, a method and system may comprise selectively programming one or more bitcells 300, 400, 500 of an array of bitcells 300, 400, 500 in a memory device 150 by applying a high voltage to a gate terminal 111 of the one or more of the array of bitcells 300, 400, 500, where the programming burns a conductive hole 415 in an oxide layer 105 above a higher threshold voltage layer in a memory device. The bitcells 300, 400, 500 may comprise an oxide layer 105 and a doped channel, which may comprise a plurality of different threshold voltage layers 317, 319. The plurality of different threshold voltage layers 317, 319 may comprise at least one layer with a higher threshold voltage 319 and at least one layer with a lower threshold voltage 317. The oxide may comprise a gate oxide 105 and the bitcell 300, 400, 500 may comprise an anti-fuse device 100. The layer with a higher threshold voltage 319 may be separated from an output terminal 113 of the bitcell 300, 400, 500 by the at least one layer with a lower threshold voltage 317. The array of bitcells 150 may comprise complementary metal-oxide semiconductor (CMOS) devices 300, 400, 500. The lower threshold voltage layer 317 may comprise a high time-dependent dielectric breakdown material and the higher threshold voltage layer 319 may comprise a low time-dependent dielectric breakdown material. A gate length of the one or more of the bitcells 300, 400, 500 may be configured by the programming. The bitcell 300, 400, 500 may comprise an NMOS or a PMOS device 300, 400, 500.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method comprising:
    in a memory device comprising an array of bitcells, each bitcell in said array of bitcells comprising an oxide layer and a doped channel, said doped channel comprising a plurality of different threshold voltage layers, said plurality of different threshold voltage layers comprising at least one layer having a higher threshold voltage and at least one layer having a lower threshold voltage:
        selectively programming one or more bitcells in said array of bitcells by applying a high voltage to a gate terminal of said one or more bitcells in said array of bitcells, wherein said programming burns a conductive hole in said oxide layer above said at least one higher threshold voltage layer.

2. The method according to claim 1, wherein said oxide comprises a gate oxide.

3. The method according to claim 1, wherein said each bitcell in said array of bitcells comprises an anti-fuse device.

4. The method according to claim 1, wherein said at least one layer having a higher threshold voltage is separated from an output terminal of said each bitcell in said array of bitcells by said at least one layer having a lower threshold voltage.

5. The method according to claim 1, wherein said each bitcell in said array of bitcells comprise a complementary metal-oxide semiconductor (CMOS) device.

6. The method according to claim 1, wherein said at least one lower threshold voltage layer comprises a high time-dependent dielectric breakdown material.

7. The method according to claim 1, wherein said at least one lower threshold voltage layer comprises a low time-dependent dielectric breakdown material.

8. The method according to claim 1, wherein said at least one higher threshold voltage layer comprises a low time-dependent dielectric breakdown material.

9. The method according to claim 1, wherein said at least one higher threshold voltage layer comprises a high time-dependent dielectric breakdown material.

10. The method according to claim 1, comprising configuring a gate length of said one or more bitcells in said array of bitcells by said programming.

11. The method according to claim 1, wherein said each bitcell in said array of bitcells comprises an NMOS device.

12. The method according to claim 1, wherein said each bitcell in said array of bitcells comprises an PMOS device.

13. A system comprising:
    a memory device comprising an array of bitcells, each bitcell in said array of bitcells comprising an oxide layer and a doped channel, said doped channel comprising a plurality of different threshold voltage layers, said plurality of different threshold voltage layers comprising at least one layer having a higher threshold voltage and at least one layer having a lower threshold voltage, said memory device being operable to:
        selectively program one or more bitcells in said array of bitcells by applying a high voltage to a gate terminal of said one or more bitcells in said array of bitcells, wherein said programming burns a conductive hole in said oxide layer above said at least one higher threshold voltage layer.

14. The system according to claim 13, wherein said oxide comprises a gate oxide.

15. The system according to claim 13, wherein said each bitcell in said array of bitcells comprises an anti-fuse device.

16. The system according to claim 15, wherein said at least one layer having a higher threshold voltage is separated from an output terminal of said each bitcell in said array of bitcells by said at least one layer having a lower threshold voltage.

17. The system according to claim 13, wherein said each bitcell in said array of bitcells comprise a complementary metal-oxide semiconductor (CMOS) device.

18. The system according to claim 13, wherein said at least one lower threshold voltage layer comprises a high time-dependent dielectric breakdown material.

19. The system according to claim 13, wherein said at least one lower threshold voltage layer comprises a low time-dependent dielectric breakdown material.

20. The system according to claim 13, wherein said at least one higher threshold voltage layer comprises a low time-dependent dielectric breakdown material.

21. The system according to claim 13, wherein said at least one higher threshold voltage layer comprises a high time-dependent dielectric breakdown material.

22. The system according to claim 13, wherein said memory device is operable to configure a gate length of said one or more bitcells in said array of bitcells by said programming.

23. The system according to claim 13, wherein said each bitcell in said array of bitcells comprises an NMOS device.

24. A method, comprising:
    in a memory device comprising an array of bitcells, each bitcell in said array of bitcells comprising an oxide layer and a doped channel, said doped channel comprising a plurality of different threshold voltage layers, said plurality of different threshold voltage layers comprising at least one layer having a higher threshold voltage and at least one layer having a lower threshold voltage:
        selectively programming one or more bitcells in said array of bitcells by applying a high voltage to a gate terminal of said one or more bitcells in said array of bitcells, wherein said programming burns a conductive hole in said oxide layer above said at least one higher threshold voltage layer and configures a gate length of said one or more bitcells in said array of bitcells.

* * * * *